(12) United States Patent
D'Angelo et al.

(10) Patent No.: US 7,831,402 B2
(45) Date of Patent: Nov. 9, 2010

(54) METHOD AND RELATED DEVICE FOR ESTIMATING TWO CURRENTS FLOWING SIMULTANEOUSLY THROUGH RESPECTIVE WINDINGS OF A POLY-PHASE ELECTRICAL LOAD DRIVEN IN SVM MODE

(75) Inventors: Giuseppe D'Angelo, Casalnuovo di Napoli (IT); Giovanni Moselli, S. Arpino (IT)

(73) Assignee: STMicroelectronics S.R.L., Agrate Brianza (MI) (IT)

(*) Notice: Subject to any disclaimer, the term of this patent is extended or adjusted under 35 U.S.C. 154(b) by 350 days.

(21) Appl. No.: 12/015,188

(22) Filed: Jan. 16, 2008

(65) Prior Publication Data

US 2008/0174260 A1   Jul. 24, 2008

(30) Foreign Application Priority Data

Jan. 17, 2007 (IT) .......................... VA2007A0011

(51) Int. Cl.
*G01R 19/00* (2006.01)
(52) U.S. Cl. .............................. 702/64; 702/57; 702/79; 702/89; 702/117; 702/127; 702/199
(58) Field of Classification Search .................... 702/57, 702/64–65
See application file for complete search history.

(56) References Cited

U.S. PATENT DOCUMENTS

| | | | | |
|---|---|---|---|---|
| 4,630,218 A | * | 12/1986 | Hurley | .......................... 702/64 |
| 4,680,695 A | * | 7/1987 | Kerkman et al. | ............ 363/160 |
| 2004/0032357 A1 | | 2/2004 | White | .......................... 341/155 |
| 2004/0195995 A1 | | 10/2004 | Quirion et al. | .............. 318/811 |
| 2005/0174076 A1 | | 8/2005 | Katanaya | ..................... 318/254 |
| 2005/0206341 A1 | | 9/2005 | Yin Ho | ........................ 318/812 |

FOREIGN PATENT DOCUMENTS

DE            19927126            1/2001

OTHER PUBLICATIONS

Richardson et al., "Implementation of a PWM Regular Sampling Strategy for AC Drives", 1989, pp. 649-656.

(Continued)

*Primary Examiner*—Hal D Wachsman
*Assistant Examiner*—Mi'schita' Henson
(74) *Attorney, Agent, or Firm*—Lisa K. Jorgenson; Allen, Dyer, Doppelt, Milbrath & Gilchrist, P.A.

(57) ABSTRACT

A method for estimating values assumed at a certain instant of each period by currents flowing respectively in two distinct windings of a poly-phase load controlled in a space vector modulation (SVM) mode, using a same measuring device, may include coupling the measuring device to the first winding and measuring a current flowing therethrough with an anticipation from the certain instant smaller than or equal to an SVM half-period. The method may also include coupling the measuring device to the second winding, measuring a current flowing therethrough at the certain instant, coupling the measuring device to the first winding, and measuring a current flowing therethrough with a delay equal to the anticipation. The method may also include estimating a value assumed at the certain instant by the current flowing through the first winding based upon the two measured values with the anticipation and with the delay respectively.

16 Claims, 12 Drawing Sheets

OTHER PUBLICATIONS

Blasko et al, "Sampling Methods for Discontinuous Voltage and Current Signals and Their influence on Bandwich of Control Loops of Electrical Drives", 1997, pp. 520-526.

Song et al., "Current Measurements in Digitally Controlled AC Drives", Jul./Aug. 2000, pp. 51-62.

* cited by examiner

METHOD AND RELATED DEVICE FOR ESTIMATING TWO CURRENTS FLOWING SIMULTANEOUSLY THROUGH RESPECTIVE WINDINGS OF A POLY-PHASE ELECTRICAL LOAD DRIVEN IN SVM MODE

FIELD OF THE INVENTION

This invention relates to space vector modulation (SVM) control of poly-phase electrical loads and more particularly to a method and a related device for estimating the values of the currents respectively flowing in two distinct windings of a poly-phase load at a certain instant of every period of the current waveforms, using the same current measuring device or instrument coupled first to a winding and then to the other winding.

BACKGROUND OF THE INVENTION

Because of the importance of control techniques of three-phase electrical motors in a star configuration, reference will be made to a motor of this kind, however the same considerations apply, with the respective differences having been considered, for any poly-phase electrical load in any configuration.

One of the most widely used techniques for the control of three-phase electric motors is the FOC (Field Oriented Control). This technique, based on so-called SVM, induces sinusoidal voltages and currents in the windings of the motor and requires an accurate measurement of the rotor position and of the phase currents of the motor.

FIG. 1 depicts a block diagram of a system for controlling the motor torque by the FOC technique. When the windings of the motor are connected in star configuration, it is sufficient to measure only two phase currents for reconstructing the values of all three-phase currents.

The phase currents of the motor $i_a$ and $i_b$ may be measured at the same instant of every modulation period. The most commonly used current sensors are sensing resistors, Hall effect sensors and current transformers. Sensing resistors are preferred in most applications because they allow a sufficiently accurate sensing and are comparably the most economic choice.

Hereinafter reference will be made to current sensing resistors, though the addressed technical problems affect also any other kind of current sensor. Normally, the signal generated by a current sensor is sampled by one or more A/D (analog/digital) converters and the performance of the control system depends primarily on the precision with which these currents are measured.

When using an inverter for driving the windings of a motor, inevitably voltage harmonics superposed on the main voltage frequency are generated. These drive voltage harmonics produce current harmonics that disturb the measurement of the current in the windings. In order to prevent or reduce spurious effects due to current harmonics, the currents should be measured at certain instants. It has been shown, as in Richardson J., "Implementation of a PWM Regular Sampling Strategy for AC Drives," that there is no contribution of harmonics superposed on the main component of the current at the beginning (instant 0) and at half (T/2) of the modulation period T. As an alternative, a method that contemplates repeated current measurements during the same period for estimating the values at instants 0 and T/2 as integral average values for the modulation period is known, as disclosed in Blasko et al., "Sampling Methods for Discontinuous Voltage and Current Signals and Their Influence on Bandwidth of Control Loops of Electrical Drives."

The method disclosed in Blasko et al. can be used for estimating two currents flowing through two windings at a same instant using two A/D converters.

Using two A/D converters is an expensive approach and it may be desirable to use a single multiplexed A/D converter, i.e. alternately connected first to a winding then to the other winding through a common multiplexer.

However, the use of a single multiplexed A/D converter raises some problems. One of the two currents is inevitably measured at a different instant of the other current. Therefore the so measured values may not be sufficiently correct and may reduce the accuracy of control. The time lag with which the pair of measured current values are sensed depends on the conversion time of the A/D converter being used and the measurement error will contain a term that depends on the rate of variation of the current at the main frequency.

Moreover, even if the second measurement is carried out as soon as possible, it will be carried out at a later instant of the instant (0 or T/2) at which the harmonics are null, thus the measurement error will contain even an undesired contribution due to current harmonics superposed on the current at the main frequency.

The error due to the variation of the current at the main frequency can be estimated by assuming the drive current is sinusoidal. The error $\Delta I$ can be defined as follows:

$$\Delta I = I(t) - I(t_0)$$

wherein $t_0$ is the instant in which the measurement was to be executed, and $$t = t_0 + \Delta t$$

is the instant in which the measurement has been effectively carried out, wherein $\Delta t$ is the conversion time of the A/D converter. Considering that:

$$I(t) = I_M \sin(\omega \cdot t + \phi)$$

wherein $$\omega = 2\pi f = 2\pi/T$$

$$\Delta I(t) = I_M (\sin(\omega \cdot t + \phi) - \sin(\omega \cdot t_0 + \phi))$$

and that the initial phase $\phi$ can be fixed equal to 0, $$\Delta I(t) = I_M (\sin(\omega \cdot t) - \sin(\omega \cdot (t - \Delta t)))$$

the first time derivative of the error is $$\frac{d\Delta I(t)}{dt} = I_M \cdot \omega \cdot (\cos(\omega \cdot t) - \cos(\omega \cdot (t - \Delta t)))$$

The maximum relative error is determined by imposing $$\frac{d\Delta I(t)}{dt} = 0$$

thus $$t = \frac{\Delta t}{2} + kT$$

-continued $$\frac{\Delta I_{MAX}}{I_M} = \frac{\Delta I_{MAX}(\Delta t/2)}{I_M} = 2 \cdot \sin\left(\frac{\pi \cdot \Delta t}{T}\right)$$

For a small size motor with four polar pairs, running at the speed of 10000 rpm, the current frequency is f=667 Hz thus if $$\frac{\Delta t}{T} = 10^{-3}$$

then $$\frac{\Delta I_{MAX}}{I_M} = 6.28 \cdot 10^{-3}$$

Considering that the resolution of a 10 bit A/D converter is $1/1023 = 9.78 \cdot 10^{-4}$ and that the precision of a sensing resistor is typically 0.1%, the error is certainly non-negligible. Apparently, it is not possible to estimate in a simple way and with sufficient precision currents flowing in a same instant through two windings of a three-phase motor or of any poly-phase electrical load, using the same measuring instrument connected once with a winding, then with another winding.

SUMMARY OF THE INVENTION

A method for estimating, at a certain instant, two currents of a poly-phase electric load controlled in SVM mode, for example a three-phase electric motor, using the same measuring instrument, without introducing in the measurement error contributory terms due to the inevitable time lag between the two measurements carried out at different instants, has now been found.

According to the method of this invention, as may be implemented in a circuit in a device, the current flowing in one of the two windings may be measured at the desired instant. The current flowing in the other winding may be measured first with a certain anticipation in respect to the desired instant, and after a delay equal to the anticipation in respect to the desired instant. The estimated value of the current in the second winding may be given in first approximation by the arithmetic mean of the two measured values before and after the desired instant of simultaneous measurement of the two currents.

According to the method of this invention, the two currents may be measured with an undecremented precision using the same A/D converter connected through a multiplexer by performing the three closely sequenced sensings of electric current.

According to another embodiment of the method of this invention, the second winding current value that is given by the arithmetic mean of the values measured first at an anticipated instant, and after a delayed instant, may be further improved by summing to it a correction term determined in function of the difference of the two measured values.

According to another embodiment of the method of this invention, particularly effective when the analog-to-digital converter is coupled to the winding on which the current may be measured through a low-pass noise fitter, the errors due to the presence of the filter may be compensated by summing a correction value to the current through the winding that is measured at the desired instant and to the estimated current flowing through the other winding.

Alternatively, in a wired or circuital implementation, the method of this invention may also be implemented via software by a microprocessor that executes a program.

DESCRIPTION OF EMBODIMENTS OF THE INVENTION

According to the method of this invention, in order to eliminate or reduce the error that normally affects estimations of currents flowing at a certain instant through two windings of a three-phase load when using a single measurement instrument, one of the two currents is measured at the desired instant (0 or T/2) of the modulation period T. The other current is measured twice at different instants preceding and following the desired instant by an anticipation and a delay not longer than half of the SVM period, respectively at instants $-\delta$ and $\delta$ (or $T/2-.\delta$ and $T/2+.\delta$).

Figure 2:
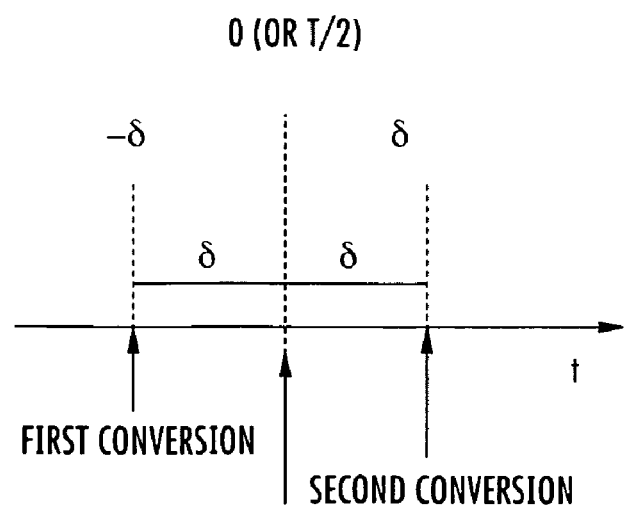
FIG. 2 illustrates how to estimate a current flowing in a certain instant according to the method of this invention.

The measuring instrument is normally coupled to one and to the other winding of the load through a low-pass filter and an analog-to-digital converter. The anticipation/delay $\delta$ is longer than the conversion time of the A/D converter, according to the scheme depicted in FIG. 2.

Investigations carried out by the applicant showed that the value of the current measured at the chosen favorable instant 0 (or T/2) can be estimated with sufficient accuracy as the arithmetic mean of the two values acquired respectively in advance, and with a delay (that is at instants $-\delta$ and $\delta$ or $T/2-.\delta$ and $T/2+.\delta$) from the chosen instant.

With this technique, a current value estimated during a single modulation period has a significantly reduced error because the error due to harmonic currents superposed to the main component is practically eliminated and the error caused by the time separation between measurement on two distinct phase windings of the load is also significantly reduced.

This measurement approach has been found effective in eliminating both contributions to the measurement error while introducing an error due to the approximation of the arithmetic mean of the two repeated measurements on one of the two windings. However, it has been found that the overall error is outstandingly reduced.

In simulations carried out for verifying the reliability of this technique, a maximum error of $10^{-3}$ for a 10A peak-to-peak current (that is a maximum relative error of $10^{-4}$) resulted, and that was by far smaller than the resolution of the A/D converter and of the precision of the sensing resistor.

Moreover, the use of a 10 bit A/D converter instead of a more expensive 12 bit converter was found justified, because a finer resolution of the A/D converter would not significantly improve accuracy of the measurements when sensing resistors are used for sensing the currents.

On another account, the novel technique of this invention requires the performance of three measurements every modulation period instead of two, as is done in the prior art, and implies a greater complexity of the control system, both in case of hardware and of software implementation.

Undoubtedly, using a single multiplexed A/D converter connected once to a winding, then to another winding of the poly-phase electric load, limits the control algorithm.

Considering that current pulses are produced when any of the switches of the inverter is opened/closed, the measurement of the currents should be completed before the output of the pulse width modulation (PWM) module used for driving the inverter changes. In case of sequential measurements, using an A/D converter with a conversion time of 3 µs and a sampling time of 1 µs, that is with the same performances of A/D converters of microcontrollers of the family ST10F2xx of commercial integrated devices, the shortest time window for correctly carrying out current measurements will be 4 µs. This is equivalent to the sum of the acquisition time of the first measurement plus the sampling time of the second measurement. The modulation frequency should be larger than 10 kHz for preventing the motor from generating audible noise, therefore, a modulation frequency of 20 kHz may be chosen, that corresponds to a modulation period of T=50 µs, and the minimum time window for measurements is about 16% of the modulation half-period.

In the hypothesis that measurements are carried out at the instant 0 of the modulation period T, a maximum duty-cycle of 84% may be fixed and this limitation implies a reduction of the maximum supply voltage of the load and thus of the maximum torque (or speed) of a three-phase motor.

By contrast, if measurements are carried out at the instant T/2 of the modulation period T, a minimum duty-cycle of 16% may be fixed and this limitation implies a reduction of the minimum torque (or speed). Of course, these limitations may be substantially eliminated by using two distinct A/D converters. In this case, the minimum time window for carrying out the measurements could be 1 µs, that is the sampling time of the two simultaneous measurements, and thus it would be equivalent to 4% of the modulation half-period. Thus, the maximum admissible duty-cycle becomes 96% or the minimum admissible duty-cycle becomes 4%.

Often, sensing resistors are coupled to the A/D converter through a low-pass filter (LPF) for limiting the rate of variation of the signal and for filtering the noise superposed thereto. The presence of a filter introduces a delay between the effective signal and the input signal of the A/D converter.

It is necessary to take into account the presence of a filter in establishing the measurement instants, as disclosed in Song et al., "Current Measurements in Digitally Controlled AC Drives," because the filter causes the measurements to occur at instants different from the chosen one (either 0 or T/2) of the modulation period T. The problem of compensating the delay introduced by the low-pass filter is extremely complex because the filter deforms the waveform of the input signal, and the delay that is introduced depends on the frequency of the signal itself.

According to the preferred embodiment of the method of this invention, the measured phase current values are generated by a single multiplexed A/D converter, with a measurement error even smaller than the resolution of a 10 bit A/D converter, and of the typical precision of a sensing resistor. The values are also generated without significantly increasing the complexity of the system, without penalizing significantly the performances of the system itself in terms of maximum or minimum duty-cycle, and also compensating the delay introduced by system components, and, in particular, by a low-pass filter connected between the current sensing elements and the A/D converter.

According to this preferred embodiment, the current in one of the two windings is measured at the instant 0 of the modulation period T, and the current in the other windings is measured at the instant T/2 of the modulation period T, or vice versa.

The measured values of the currents are incoherent because the two currents are not measured at the same instant. However, by measuring the two currents at the instant 0 of the modulation period T, the value of the current i at the instant 0 could be approximated according to the relation $$i(0) = \frac{i(-T/2) + i(T/2)}{2}$$

wherein the value i(−T/2) is the value measured during the previous modulation period, and the value i(T/2) is the value measured during the current modulation period.

The error due to the interpolation operation of the current and the error due to the delay introduced by the low-pass filter for both currents may be compensated by summing appropriate correction terms.

The method of this invention can be implemented in a purposely designated device, the block scheme of which will be illustrated in the following description, or via software by a microcontroller of the family ST10F2xx.

Figure 3:
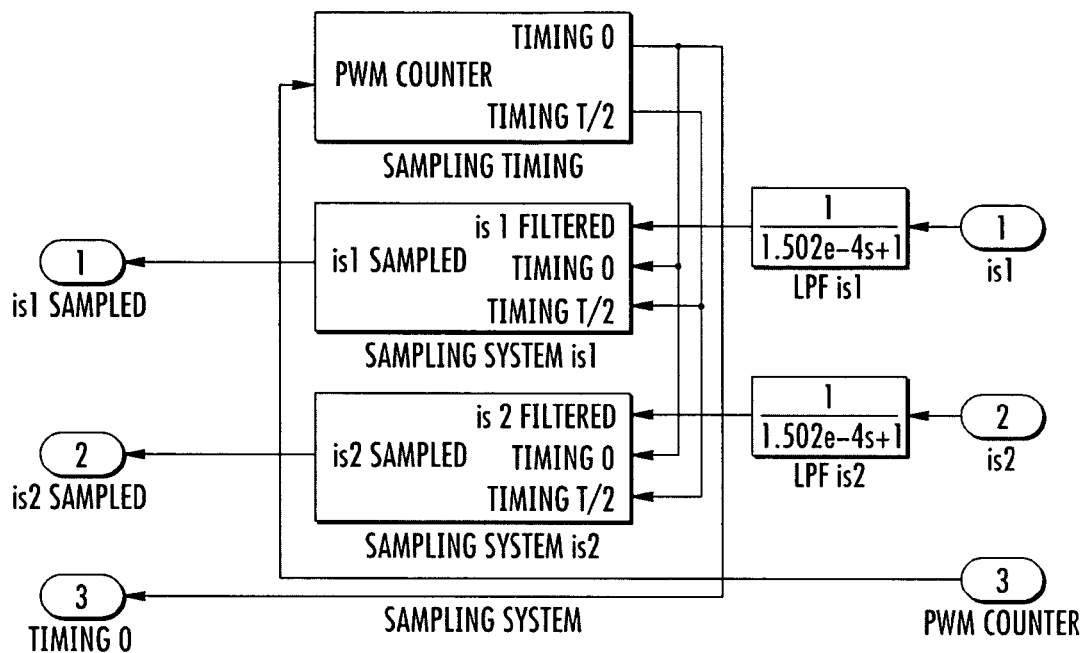
FIG. 3 depicts a device of this invention for estimating the currents flowing through two windings of a three-phase load.

FIG. 3 depicts a block diagram of a preferred embodiment of the device of this invention. The device is input with two of the three phase currents of the motor IS1 and IS2, filtered through a low-pass filter for eliminating the superposed noise, and the digital value PWM Counter, coming from a counter of the PWM peripheral circuit block that, during the modulation period T varies between 0 and T−1.

The device outputs the digital value of the measured phase currents and the timing signal TIMING0 of the calculation block of the control algorithm, the inner architecture of which is omitted, as it is not part of this invention.

Figure 4:
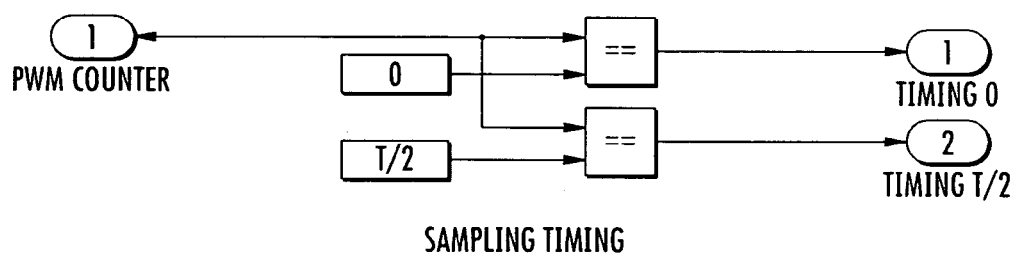
FIG. 4 is a detailed view of the block SAMPLING TIMING of FIG. 3.

FIG. 4 depicts the inner architecture of the block SAMPLING TIMING. This block is input with the value of the counter of the PWM peripheral and outputs the signals useful for timing the blocks SAMPLING SYSTEM IS1 and SAMPLING SYSTEM IS2. These timing signals assume a logic value 1 only in the time interval in which the counter assumes values 0 and T/2.

Figure 5:
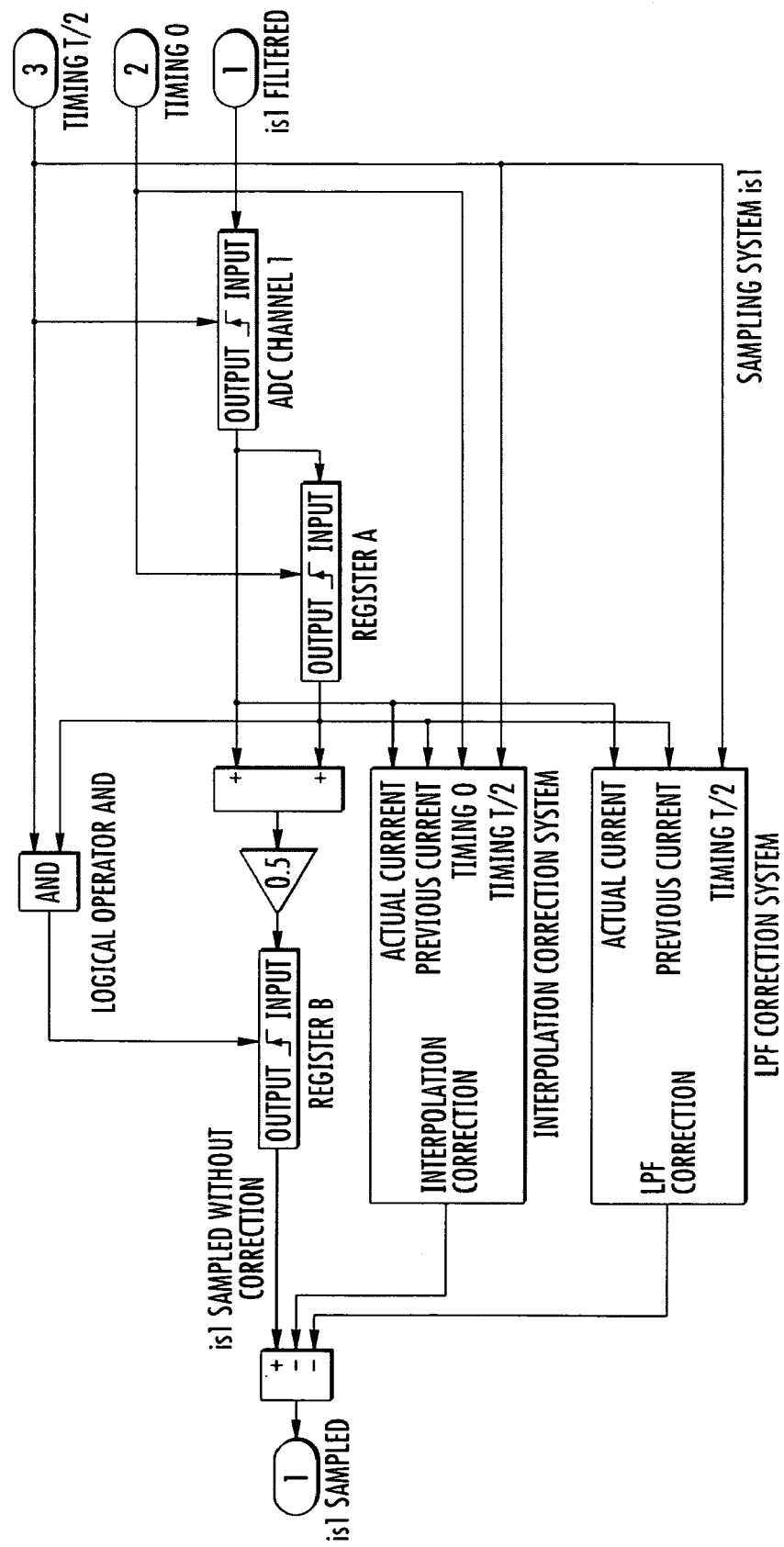
FIG. 5 is a detailed view of the block SAMPLING SYSTEM IS1 of FIG. 3.

FIG. 5 is a detailed view of the block SAMPLING SYSTEM IS1. This block is input with the value of the filtered current IS1 and the timing signals. In particular, at the instant T/2, through the appropriate timing signal, the current is sampled through a channel of the A/D converter. This value, at the instant 0, is stored in the register A, such that, at the instant T/2 of each modulation period, the previous value of the current is stored in the register A. The mean value is stored at the instant T/2 in register B and is corrected by the outputs of the blocks INTERPOLATION CORRECTION SYSTEM and LPF CORRECTION SYSTEM.

The register B is enabled by the logic AND between the timing signal T/2 and the output of the register A in order to prevent an initial error, due to the fact that no value is stored in the register A in the first modulation period. However, this control may be omitted without altering the steady-state functioning of the device.

Figure 6:
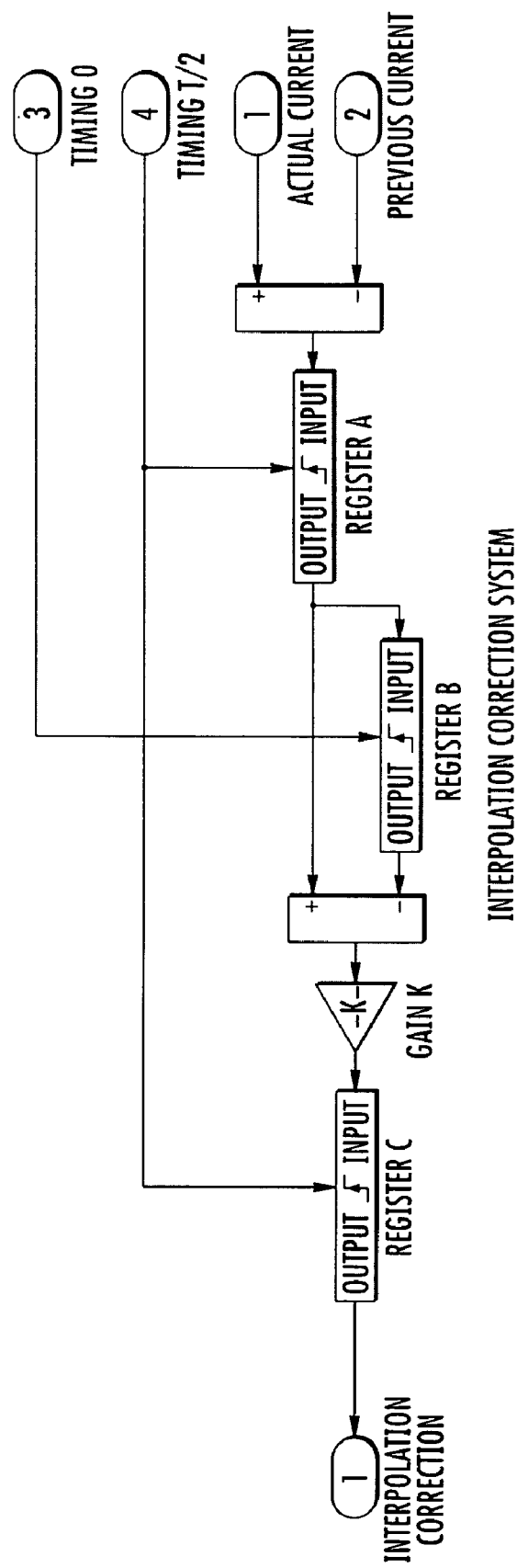
FIG. 6 is a detailed view of the block INTERPOLATION CORRECTION SYSTEM of FIG. 5.

FIG. 6 depicts the block INTERPOLATION CORRECTION SYSTEM. The block is input with the current value and with the previous value of the current IS1 and evaluates the correction term as a variation of the variation of the current, that is $$K1 \cdot ((i_{s1}(T/2) - i_{s1}(-T/2)) - (i_{s1}(-T/2) - i_{s1}(-T-T/2)))$$

that in practice is the second discrete derivative calculated on a modulation period of the current. In the register A the variation of the current in the SVM period is stored at the instant T/2. The variation in the previous SVM period is stored at instant 0 in the register B, and the correction term given by the previous formula is stored in the register C. The proportionality factor K1 is fixed by trial and error during an off-line test.

Figure 7:
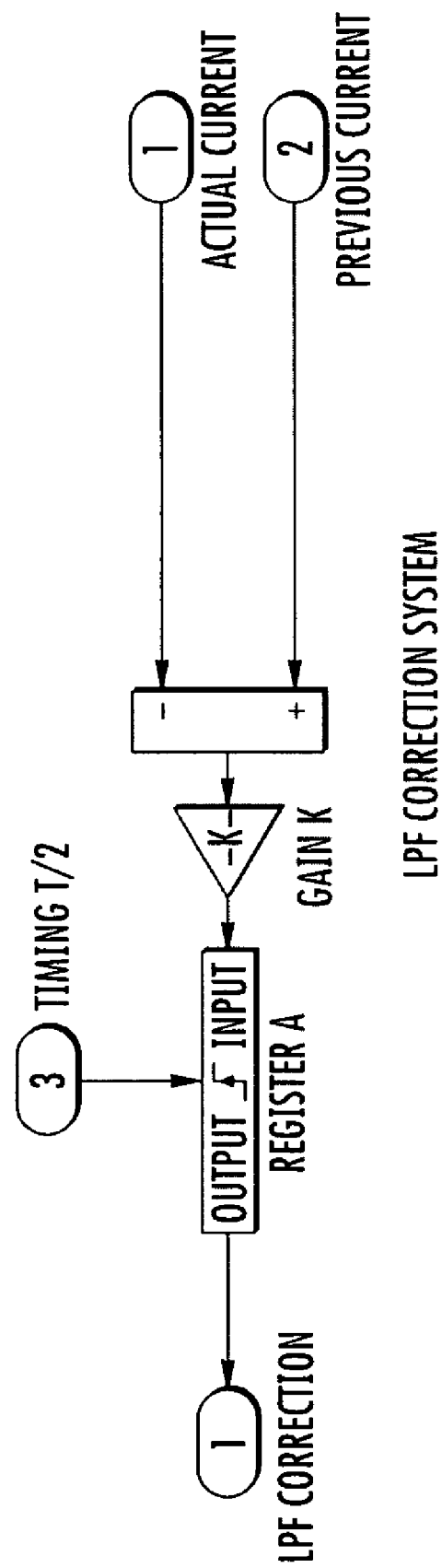
FIG. 7 is a detailed view of the block LPF CORRECTION SYSTEM of FIG. 5.

FIG. 7 depicts the block LPF CORRECTION SYSTEM. The block is input with the current value and with the previous value and stores in the register A at the instant T/2 the difference between these values, properly scaled by a proportionality factor K2. The value of the factor K2 is established by trial and error during an off-line test because it depends on the characteristics of the low-pass filter.

Figure 8:
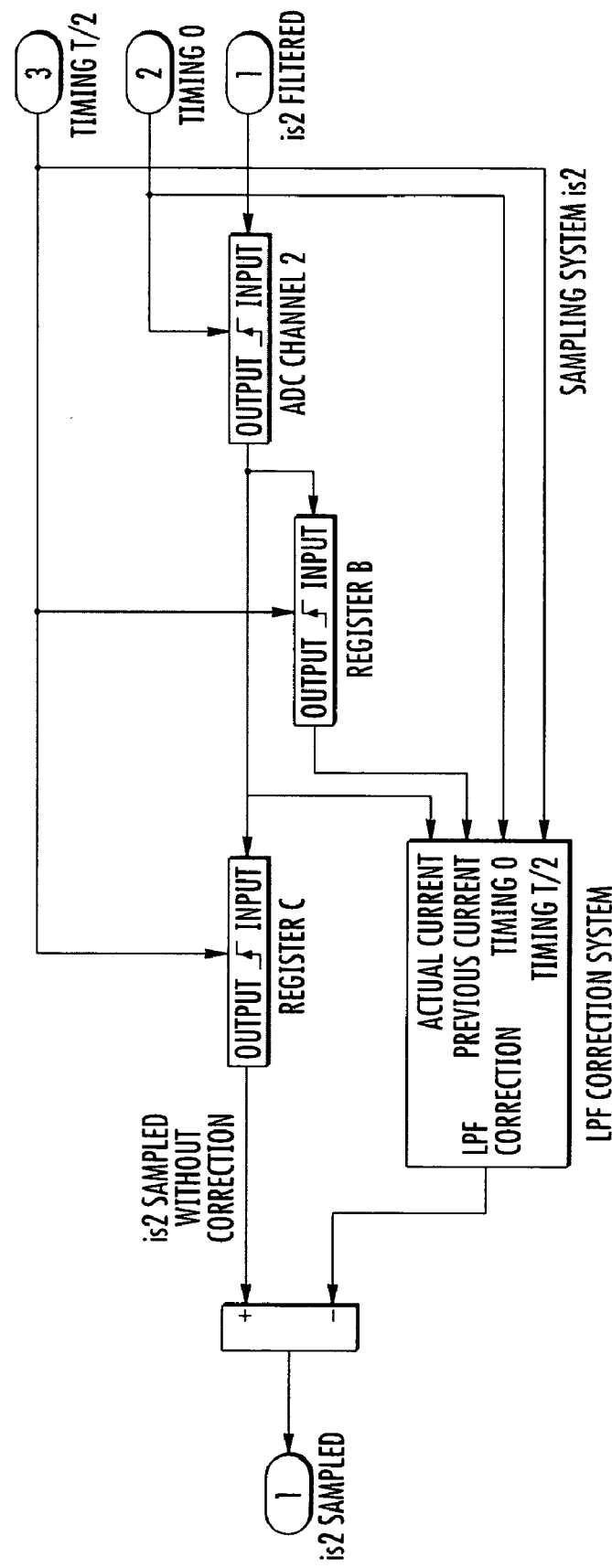
FIG. 8 is a detailed view of the block SAMPLING SYSTEM IS2 of FIG. 3.

FIG. 8 depicts in detail the block SAMPLING SYSTEM IS2. This block is input with the value of the filtered current IS2 and with the timing pulses TIMING0, TIMINGT/2 at instants 0 and T/2, respectively. More particularly, at the instant 0, using the respective timing signal, the current is sampled through the channel 2 of the A/D converter. This value, at the instant T/2 is stored in the register B, thus at the instant T/2 of each modulation period the register B stores the previous value of the current. This value is stored at the instant T/2 in the register C and it is corrected with the output of the block LPF CORRECTION SYSTEM.

Figure 9:
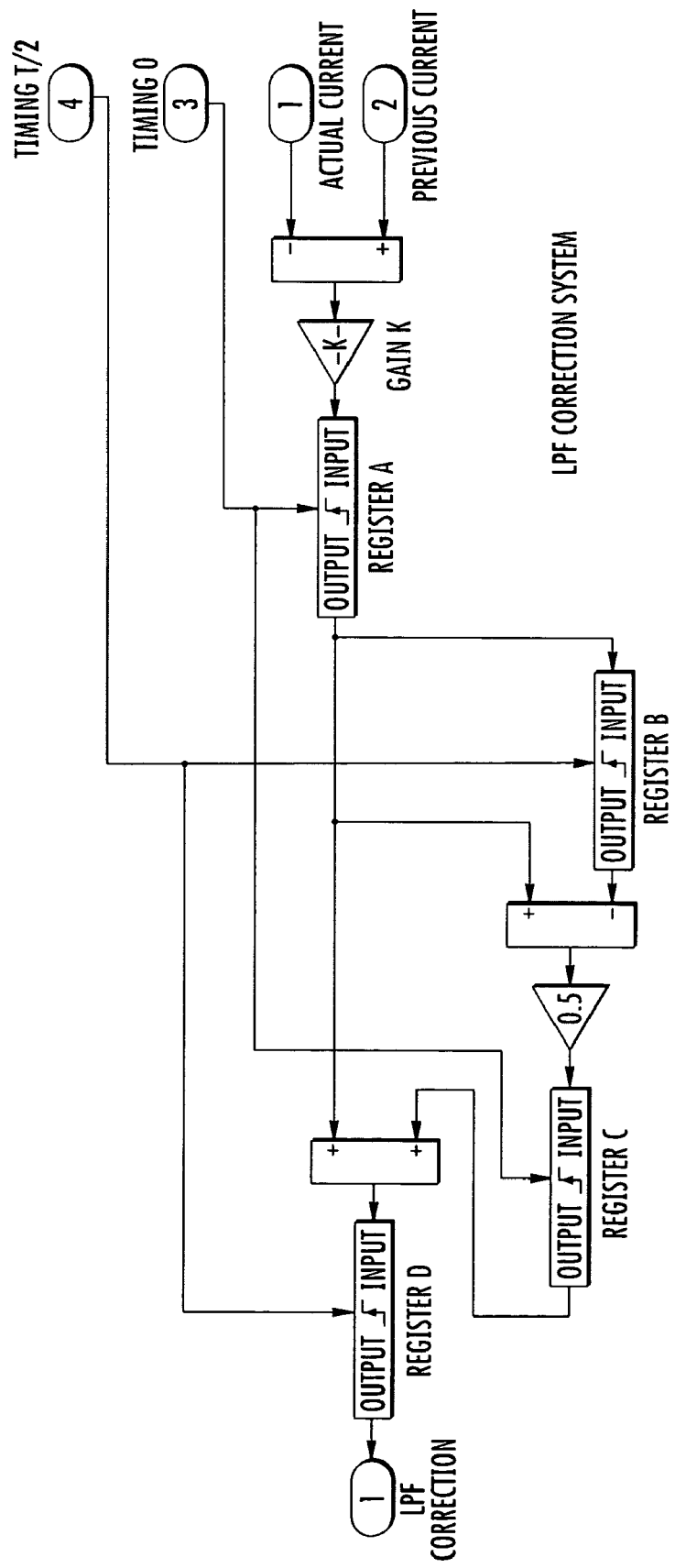
FIG. 9 is a detailed view of the block LPF CORRECTION SYSTEM of FIG. 8.

FIG. 9 depicts the block LPF correction system. It is input with the current value and the previous value of the current and stores the difference between these two values, properly scaled by the factor K3, in the register A at the instant 0. The value of the constant K3 may be established by trial and error during an off-line test phase depending on the characteristics of the low-pass filter.

Preferably, it is identical to the value K2 used for the current IS1.

The value stored in the register A is transferred in the register B at the instant T/2 such that this register, for each modulation period, contains the previous value of the difference between the current value and the previous value of the current. This previous difference is scaled and summed to the current difference between the currents for compensating an actuation delay of the correction of a half-period in respect to the previous case. The final correction term is stored in the register D at the instant T/2.

Simulation Results

Figure 10:
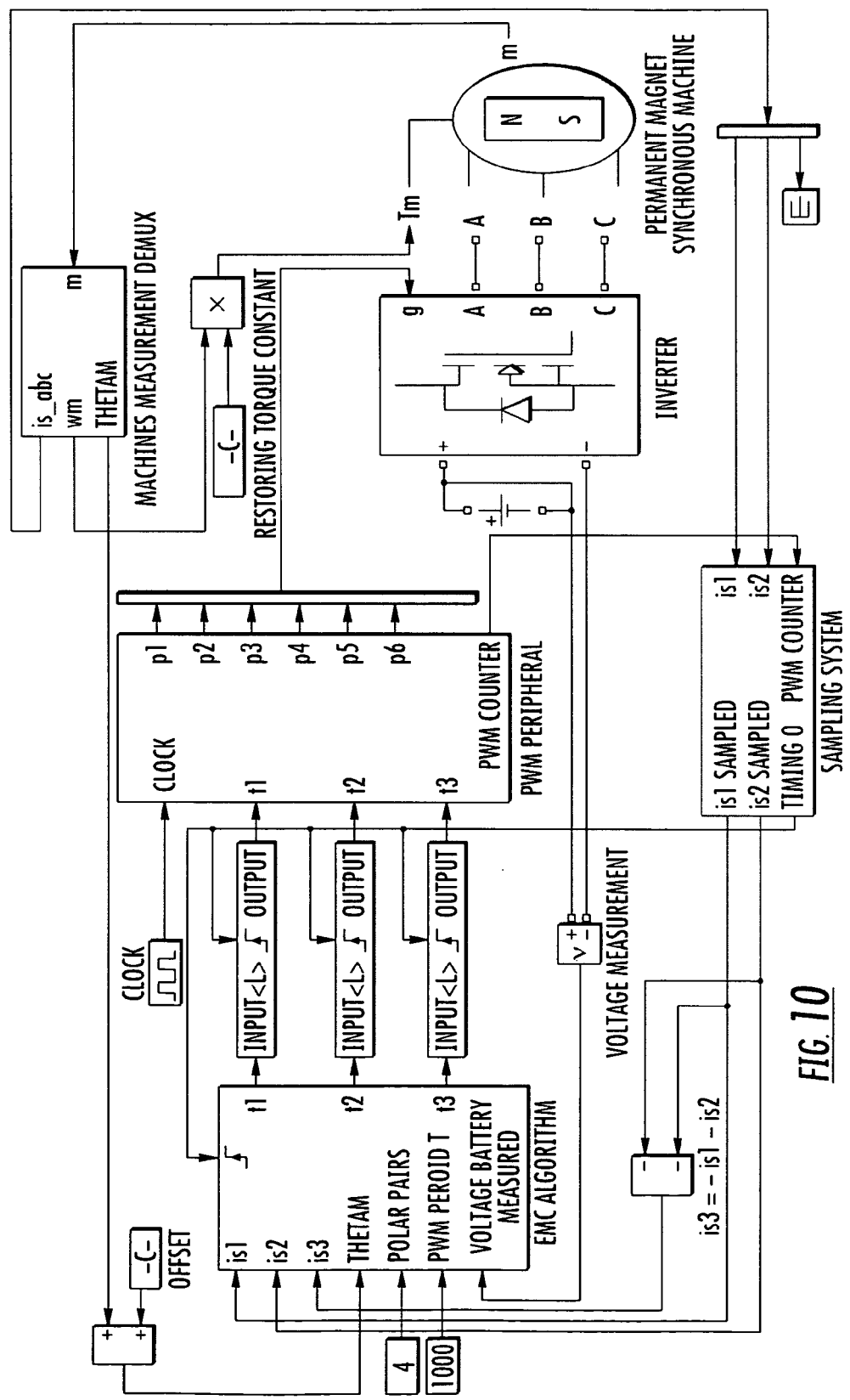
FIG. 10 is a detailed view of the device of this invention of FIG. 3.

FIG. 10 shows in detail the device SAMPLING SYSTEM that implements the method of this invention for estimating the currents flowing at a same instant through two phases of a three-phase load using a single measurement instrument.

Figure 1:
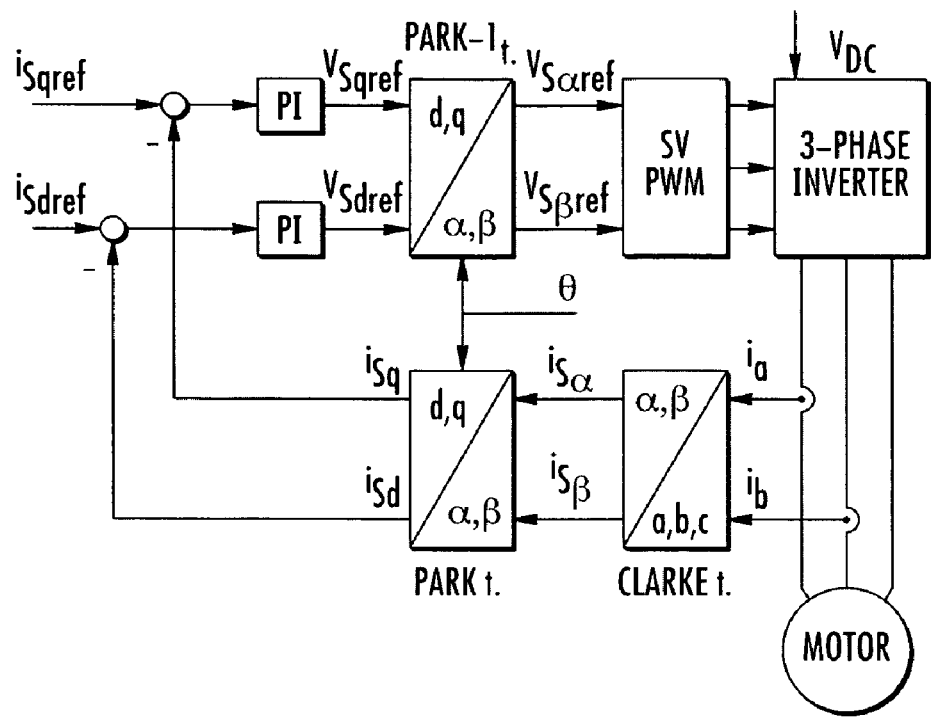
FIG. 1 depicts a FOC control scheme of a three-phase motor as in the prior art.
Figure 11:
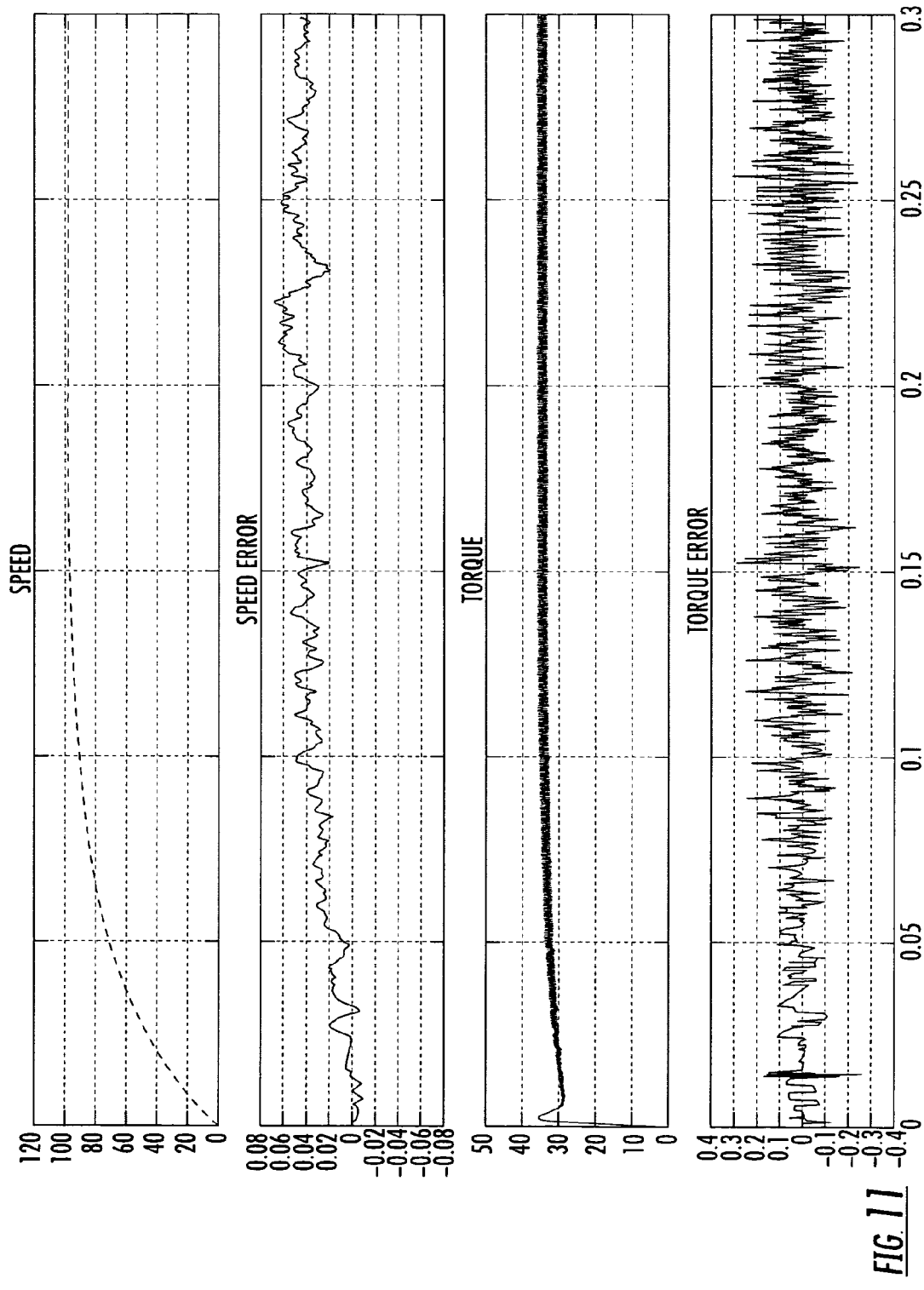
FIGS. 11 to 14 depict waveforms of the main signals of the device of FIG. 10 obtained during a simulation.

The diagrams of FIG. 11 compare the speed and the torque of a three-phase motor, input with a pre-established input pattern and controlled according to the scheme of FIG. 1 using the device of this invention, with the effective values and the corresponding errors. The effective values are obtained by simultaneously measuring the currents in the same instant using two A/D converters connected directly to the windings without low-pass filters. Thus, it is a purely ideal system that it is not affected by any error. The difference between the two graphs is extremely reduced, and it is possible to notice that it is essentially due to a slight time delay in the evolution both of the speed as well as of the motor torque and it is not due to an increase of the ripple of the speed and/or of the torque.

Figure 12:
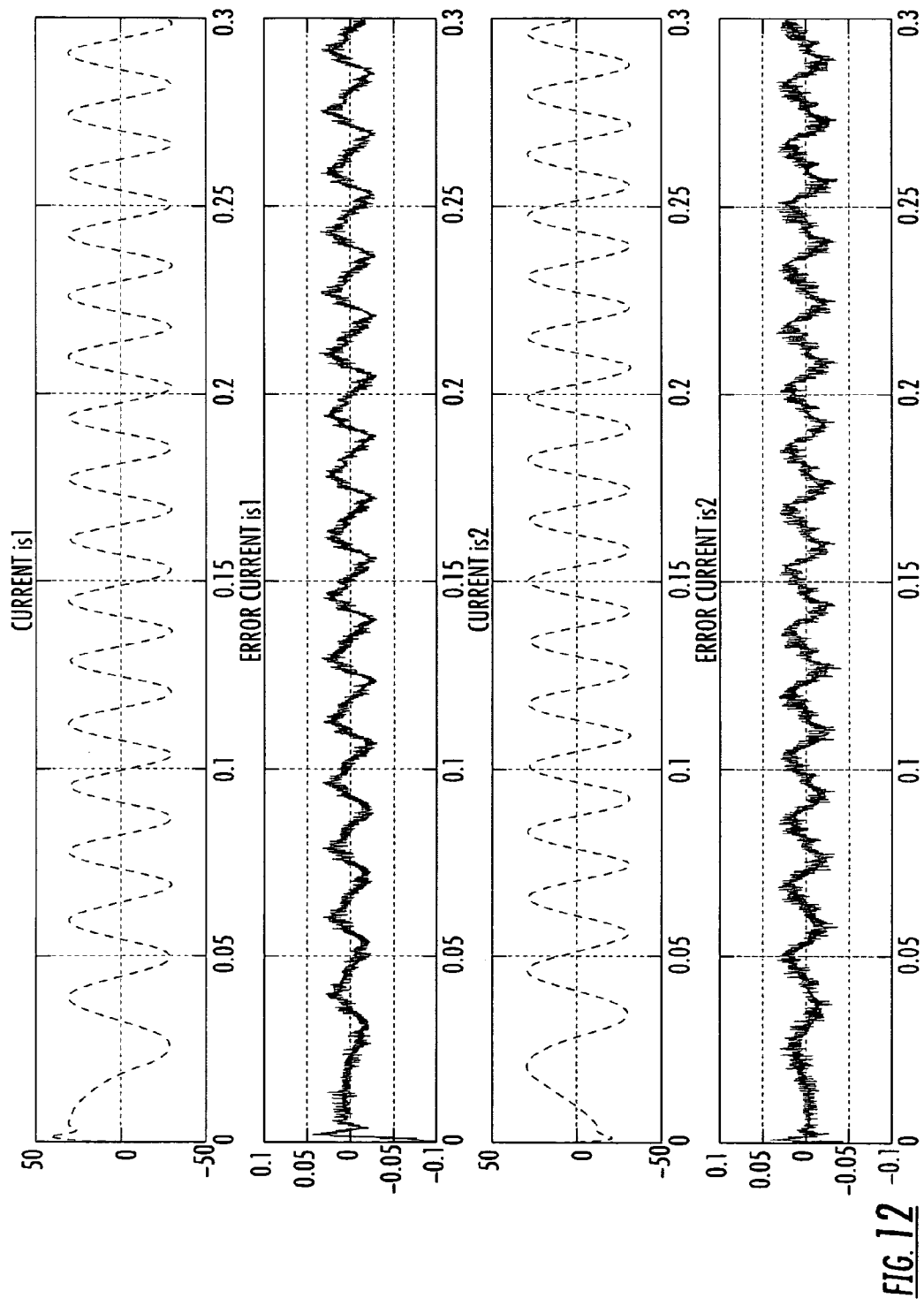

FIG. 12 depicts the waveforms of the currents IS1 and IS2 input to the low-pass filter and output by the block SAMPLING SYSTEM, respectively. In both cases the waveforms are practically coincident. The measurement errors related to the currents IS1 and IS2 are depicted. In both cases the maximum absolute value is smaller than $4 \cdot 1^{-2}$, thus the maximum relative error is smaller than $6.67 \cdot 10^{-4}$, thus it is negligible, for a peak-to-peak current of 60A.

Figure 13:
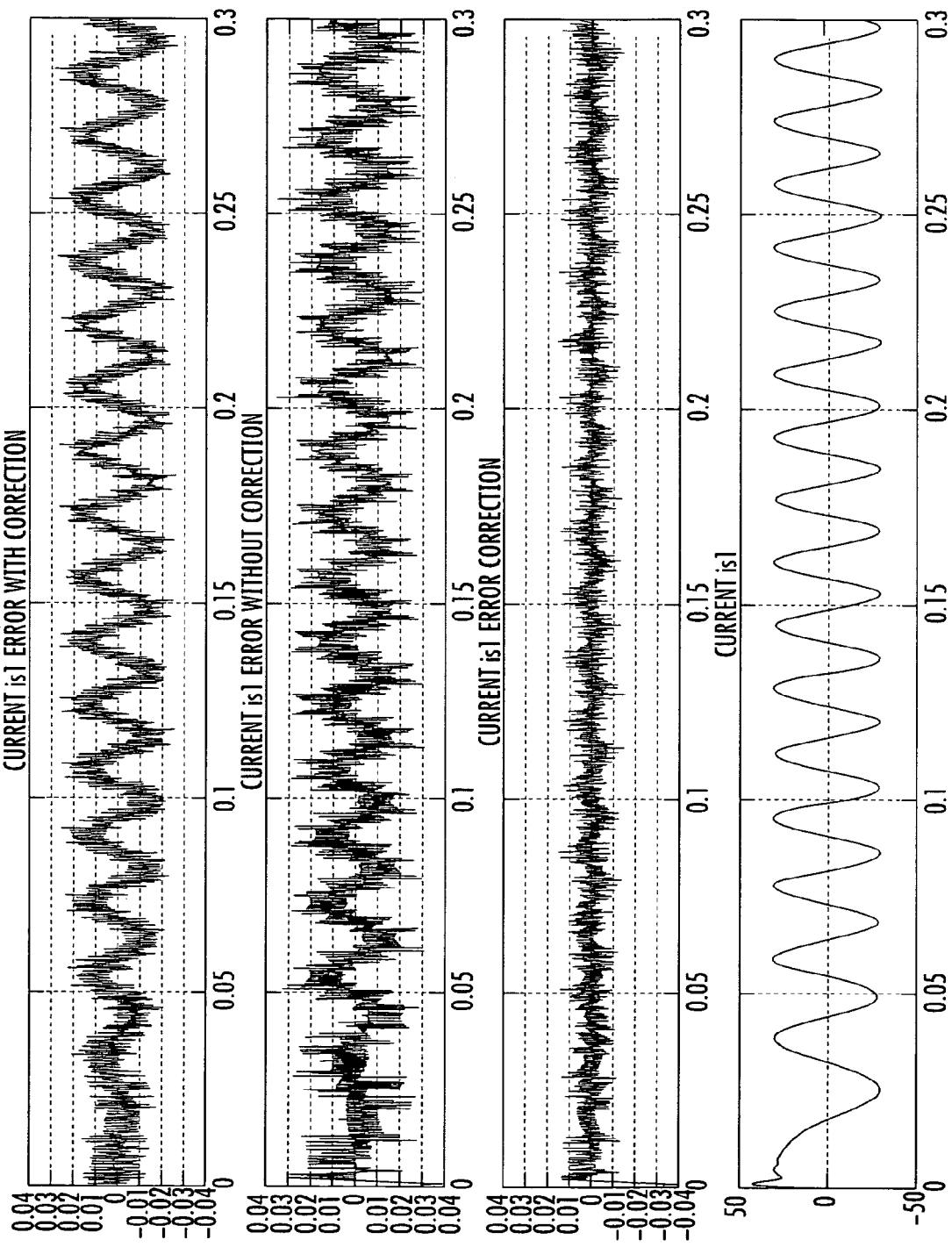
Figure 14:
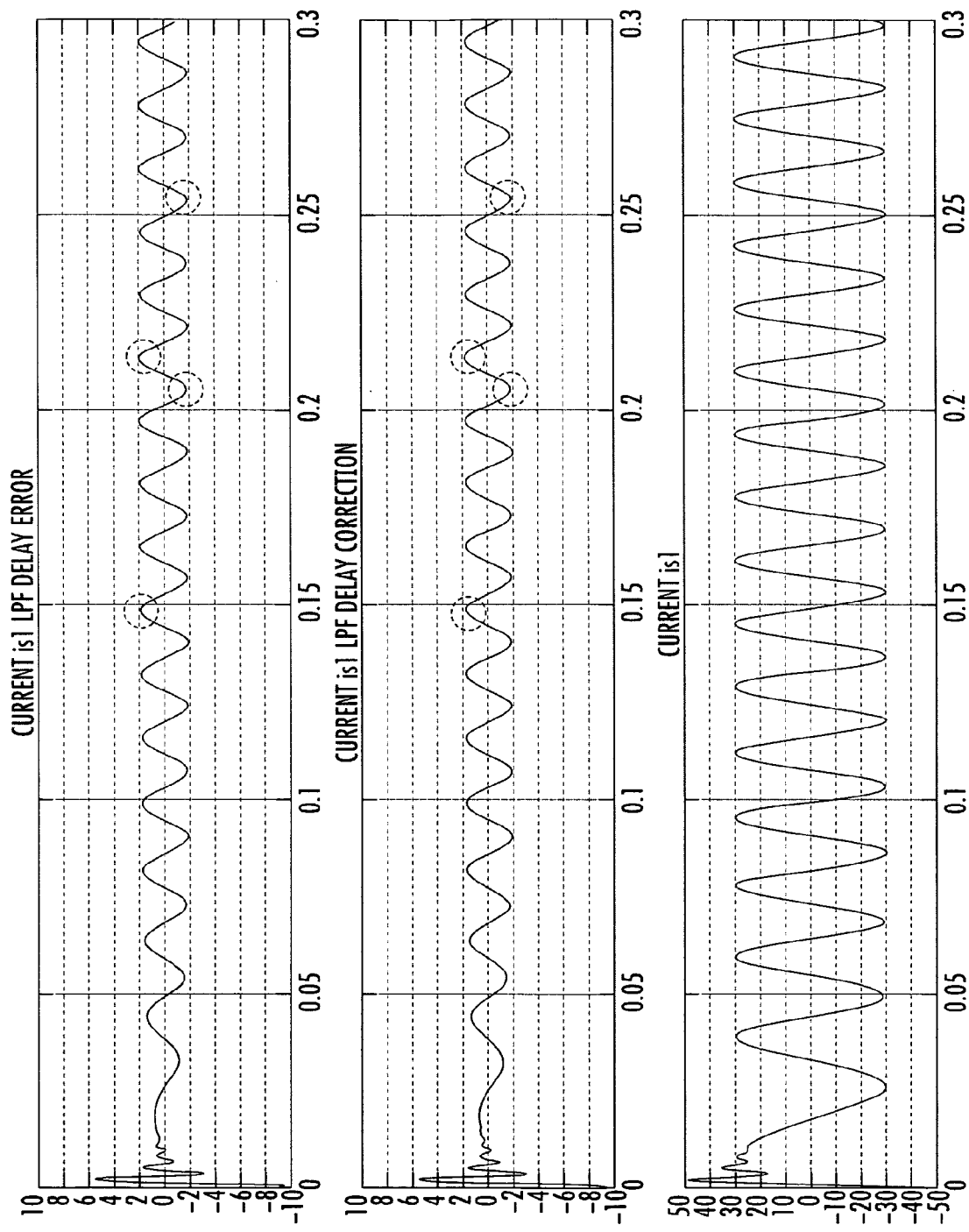

FIGS. 13 and 14 show errors due to the interpolation operation and to the delay, respectively, introduced by the low-pass filter. The correction of the error due to the interpolation operation generates a compensation of the acceleration due substantially to the action of the control, but an error due to the linear approximation of a sinusoidal waveform is still present. By contrast, the correction tracks the error caused by the presence of the low-pass filter, the local variations being negligible. The dashed circumferences highlight that the correction term tracks precisely the error caused by the low-pass filter.

By resuming, the device of this invention has the following advantages:

- it may be realized very easily, because it implements simple operations such as additions and/or subtractions, multiplications and transfers of data from a register to any other;
- it allows a reduction of the costs of implementation of current measurement on two phase windings of a poly-phase electric load because, by carrying out the measurements at different instants using a single multiplexed A/D converter instead of two A/D converters;
- the duty-cycle may range from 4% up to 96%, in the case of an A/D converter with a sampling time of 1 μs and a modulation frequency of 20 kHz;
- it effectively compensates with simple calculations, the error due to the delay introduced by a low-pass filter interposed between the current sensor and the A/D converter for eliminating noise superposed to the useful signal;
- it has a negligible overall maximum relative error, being smaller than the typical resolution of $9.78 \cdot 10^{-4}$ of a 10 bit A/D converter and of the typical precision of a sensing resistor, and it introduces negligible deviations on torque and speed compared to a device that measures the two phase currents simultaneously, moreover, without introducing disturbances due to higher order harmonics and to low-pass filter distortion.

That which is claimed:

1. A method for estimating values of currents at a certain instant of each period, the currents flowing respectively in two windings of a poly-phase load controlled in a space vector modulation (SVM) mode, using a same measuring device alternately coupled to the two windings, comprising:
   coupling the measuring device to the first winding and measuring a current flowing therethrough with an anticipation from the certain instant, the anticipation being smaller than or equal to an SVM half-period;

coupling the measuring device to the second winding and measuring a current flowing therethrough at the certain instant;

coupling the measuring device to the first winding and measuring a current flowing therethrough with a delay equal to the anticipation; and estimating, at the certain instant, a value of the current flowing through the first winding based upon the two measured values with the anticipation and with the delay respectively.

2. The method of claim 1, wherein estimating, at the certain instant, the value of the current flowing through the first winding is based upon the arithmetic mean of the two measured values.

3. The method of claim 1, wherein the anticipation and the delay equal half of an SVM period.

4. The method of claim 1, further comprising correcting, at the certain instant, the estimated value of the current flowing through the first winding based upon the two measured values by summing thereto a correction term proportional by a first proportionality factor to a difference between a difference between the values measured with the delay and the anticipation in a current SVM period and a difference between the values measured with the delay and with the anticipation in a previous SVM period.

5. The method of claim 4, wherein using the same measuring device comprises using an analog-to-digital converter alternately connected to two sensing resistors crossed by the current flowing through the two windings by at least one low-pass filter, the method further comprising:

Correcting, at the certain instant, the estimated value of the current flowing through the first winding based upon the two measured values by summing thereto a correction term proportional by a second proportionality factor to a difference between the values measured with the anticipation and with the delay in the current SVM period;

correcting a value measured by coupling the measuring device to the second winding and measuring the current flowing therethrough at the certain instant by summing to it a correction term proportional by a third proportionality factor to a sum between a difference between a value measured in the current SVM period and a corresponding value measured in the previous SVM period, and half of a difference between a difference between the value measured in the current SVM period and the corresponding value measured in the previous SVM period and a difference between the value measured in the previous SVM period and the corresponding value measured in a second SVM period that precedes the current period.

6. The method of claim 5, further comprising:

establishing in an off-line test phase, the first, second, and third proportionality factors, and comprising controlling the windings of the load with a pre-established voltage pattern, measuring the current in each of the windings at a same time in the certain instant of each SVM period with respective auxiliary measurement devices, estimating values of the currents flowing through the two windings by at least summing thereto a correction term proportional by each respective proportionality factor to a difference between the values measured with the delay and with the anticipation in the current SVM period and a difference between the values measured with the delay and with the anticipation in the previous SVM period, correcting, at the certain instant, the estimated value of the current flowing through the first winding based upon the two measured values by summing thereto a correction term proportional by a second proportionality factor to a difference between the values measured with the anticipation and with the delay in the current SVM period, correcting a value measured by coupling the measuring device to the second winding and measuring the current flowing therethrough at the certain instant by summing to it a correction term proportional by a third proportionality factor to a sum between a difference between a value measured in the current SVM period and a corresponding value measured in the previous SVM period, and half of a difference between a difference between the value measured in the current SVM period and the corresponding value measured in the previous SVM period and a difference between the value measured in the previous SVM period and the corresponding value measured in a second SVM period that precedes the current period, and using test values for the first, second, and third proportionality factors, and adjusting the first, second, and third proportionality factors to minimize a difference between estimated currents and measured currents by the respective auxiliary measurement devices.

7. A non-transitory computer-readable medium having a program loadable in an internal memory of a computer comprising:

software code for estimating the values assumed at a certain instant of each period by currents flowing respectively in two windings of a poly-phase load controlled in a space vector modulation (SVM) mode, using a same measuring device alternately coupled to the two windings, by at least, coupling the measuring device to the first winding and measuring a current flowing therethrough with an anticipation from the certain instant, the anticipation being smaller than or equal to an SVM half-period;

coupling the measuring device to the second winding and measuring a current flowing therethrough at the certain instant;

coupling the measuring device to the first winding and measuring a current flowing therethrough with a delay equal to the anticipation; and estimating, at the certain instant, a value of the current flowing through the first winding based upon the two measured values with the anticipation and with the delay respectively.

8. The non-transitory computer-readable medium of claim 7, wherein estimating, at the certain instant, a value of the current flowing through the first winding is based upon the arithmetic mean of the two measured values.

9. A device generating signals representative of values at instants of each period by currents flowing respectively in first and second windings of a poly-phase load controlled in a space vector modulation (SVM) mode comprising:

a measuring device to be alternately coupled to the first and second windings;

a first logic circuit to generate a first signal representative of a current flowing through the first winding estimated by coupling the measuring device to the first winding and measuring a current flowing therethrough with an anticipation from a certain instant, the anticipation being smaller than or equal to an SVM half-period, said first logic circuit to couple the measuring device to the first winding and measure a current flowing therethrough with a delay equal to the anticipation;

a second logic circuit to generate a second signal representative of a current flowing through the second winding measured by coupling the measuring device to the second winding and measuring a current flowing therethrough at the certain instant; and a timing circuit that provides to said first logic circuit and to said second logic circuit, first and second pulse signals that fix measurement instants of the current through the first and second windings respectively.

10. The device of claim 9, wherein the anticipation and the delay equal one half of an SVM period.

11. The device of claim 9, wherein estimating, at the certain instant, a value of the current flowing through the first winding is based upon the arithmetic mean of the two measured values.

12. The device of claim 9, wherein said measuring device comprises:

at least two sensing resistors each in series with a respective phase of the first and second windings of the poly-phase load;

a first and second identical low-pass filter coupled to filter a voltage drop on a respective sensing resistor from noise and for generating a respective filtered voltage; and an analog-to-digital converter alternately coupled to at least one of said first or second identical low pass filters for converting the respective filtered voltage in a digital signal.

13. A device generating signals representative of values at instants of each period by currents flowing respectively in first and second windings of a poly-phase load controlled in a space vector modulation (SVM) mode, the device comprising:

a measuring device to be alternately coupled to the first and second windings;

at least one logic circuit to couple said measuring device to the first winding and measure a current flowing therethrough with an anticipation from a certain instant smaller than or equal to an SVM half-period, couple said measuring device to the second winding and measure a current flowing therethrough at a certain instant, and couple said measuring device to the first winding and measure a current flowing therethrough with a delay equal to the anticipation; and an estimator coupled to said at least one logic circuit to estimate, at the certain instant, a value of the current flowing through the first winding based upon the two measured values with the anticipation and with the delay respectively.

14. The device of claim 13, wherein said estimator is for estimating, at the certain instant, a value of the current flowing through the first winding is based upon the arithmetic mean of the two measured values.

15. The device of claim 13, wherein the anticipation and the delay equal half of an SVM period.

16. The device of claim 13, wherein said measuring device comprises:

at least two sensing resistors each in series with a respective phase of the first and second windings of the poly-phase load;

a first and second identical low-pass filter coupled to filter a voltage drop on a respective sensing resistor from noise and for generating a respective filtered voltage; and an analog-to-digital converter alternately coupled to at least one of said first or second identical low pass filters for converting the respective filtered voltage in a digital signal.

* * * * *